US006023123A

United States Patent [19]

Petiet

[11] Patent Number: 6,023,123

[45] Date of Patent: Feb. 8, 2000

[54] ACOUSTIC VIBRATION GENERATOR

[75] Inventor: Willem Petiet, Delden, Netherlands

[73] Assignee: Hollandse Signaalapparaten B.V., Hengelo, Netherlands

[21] Appl. No.: 08/945,548

[22] PCT Filed: Apr. 22, 1996

[86] PCT No.: PCT/EP96/01691

§ 371 Date: Nov. 3, 1997

§ 102(e) Date: Nov. 3, 1997

[87] PCT Pub. No.: WO96/35313

PCT Pub. Date: Nov. 7, 1996

[30] Foreign Application Priority Data

May 2, 1995 [NL] Netherlands ........................... 1000275

[51] Int. Cl.[7] ........................................ H01L 41/08

[52] U.S. Cl. .......................... 310/322; 310/324; 310/334; 310/316; 310/326; 381/190

[58] Field of Search .................................... 310/322, 324, 310/334, 335, 321, 316, 326; 381/158, 190

[56] References Cited

U.S. PATENT DOCUMENTS

| | | | |
|---|---|---|---|
| 4,048,454 | 9/1977 | Barcus et al. | 310/322 X |
| 4,352,961 | 10/1982 | Kumada et al. | 310/324 X |
| 5,357,578 | 10/1994 | Taniishi | 310/324 X |
| 5,400,414 | 3/1995 | Thiele | 381/190 |

FOREIGN PATENT DOCUMENTS

| | | | |
|---|---|---|---|
| 0151286 | 11/1980 | Japan | 310/322 |

*Primary Examiner*—Mark O. Budd
*Attorney, Agent, or Firm*—Oblon, Spivak, McClelland, Maier & Neustadt, P.C.

[57] ABSTRACT

The invention relates to an arrangement for generating sound waves or anti-sound waves. For the sound waves. For the sound wave transducer, use can be made of window glass (1) or other types of transparent material, which is set into vibration by means of one or a plurality of actuators (6), such as piezo elements or actuators based on electrostatic attraction and repulsion.

7 Claims, 3 Drawing Sheets

ACOUSTIC VIBRATION GENERATOR

The invention relates to an arrangement for effecting acoustic vibrations in a medium, for instance air, at least comprising a substantially sheet-shaped body for transmitting the vibrations to the medium, provided with at least one actuator that can be connected to a signal generator.

DISCUSSION OF THE BACKGROUND

Arrangements of this sort, also called sound generators, are sufficiently well-known in the art, particularly owing to their application as loudspeaker for playing music. A sound generator can, however, also be used for generating anti-sound. Sound waves acting from outside sources on an enclosed space can often be effectively attenuated by recording these waves with a sound recorder and by subsequently transmitting them in phase opposition to a sound generator.

SUMMARY OF THE INVENTION

The object of the present invention is to integrate in an inventive manner a sound generator in a windowpane, in particular for application in a building, but also in a vehicle or a vessel. Instead of or in addition to window glass, use is also made of transparent synthetic materials which can be applied as a thin layer of foil. The advantage of this is that most buildings contain plenty of window glass or suchlike materials which, owing to their flexibility, are excellently suitable for generating acoustic vibrations. Use can be made of window glass or suchlike materials which is for instance on the outside provided with a mirror coating in order to exclude disturbing sunlight or to prevent people from looking in. The use of window glass or suchlike materials as sound generator eliminates the necessity to incorporate loud speakers.

In order to realize the above inventive principle, said arrangement is characterized in that the at least one substantially sheet-shaped body comprises at least one surface that is substantially transparent to visible light in one or two directions.

An advantageous embodiment is based on double-glazed windows which are widely used for their insulating properties. This offers possibilities for incorporating, in a simple manner, the required actuator(s) in a window.

This exceptional embodiment of the arrangement according to the invention is thereto characterized in that the at least one body comprises two substantially parallel windowpanes which enclose a certain space.

In this case, one windowpane preferably has a substantially higher vibrational rigidity than the other windowpane. Thus, a directional sensitivity is realized. The generated acoustic vibrations are then substantially transmitted on the side of the windowpane having low vibrational rigidity. The windowpane combination can then be fitted in a house or building such that the window having low vibrational rigidity is on the inside.

In the embodiment comprising two parallel windowpanes, an actuator can now be added in a simple manner by applying an electrically conductive layer to both windowpanes, for instance in a vapour deposition process. By applying a voltage difference over both layers that varies with the signal strength supplied by the electric signal generator, the two windowpanes will either repel or attract one another, depending on the signal shape applied. The amplitude of the voltage difference shall be sufficiently high, generally in the order of kilovolts.

An advantageous embodiment is thereto characterized in that the two windowpanes are at least partially provided with an electrically conductive layer, which two electrically conductive layers in combination constitute the actuator during the creation of a voltage difference between the two layers.

In a further advantageous embodiment comprising two parallel windowpanes, a piezo element is used as actuator. By positioning the piezo element in the space between the two windowpanes and mechanically connecting the element to both windowpanes, an actuator is obtained which, in combination with the two windowpanes, is capable of realizing a high sound pressure level.

This embodiment is thereto characterized in that the actuator comprises a piezo element positioned in the space between the two windowpanes, which piezo element is mechanically connected to both windowpanes.

In a further favourable embodiment comprising two parallel windowpanes, the actuator is realized by a gas confined in the space between the windowpanes. This embodiment is thereto characterized in that in that the space contains a gas which constitutes the actuator and in that a connecting line is provided to connect the space with a pneumatic signal generator.

Instead of a gas, a liquid can also be used as actuator. This embodiment is thereto characterized in that the space contains a transparent liquid which constitutes the actuator and in that a connecting line is provided to connect the space with a hydraulic signal generator.

In order to make use of the glass panes of which there are plenty in most buildings, an advantageous embodiment is characterized in that the at least one body comprises at least one sheet of glass.

The arrangement according to the invention is preeminently suitable for generating anti-sound vibrations. This embodiment is in particular being applied in buildings located in the vicinity of airports or motorways. This advantageous embodiment is thereto characterized in that the actuator is connected to a signal generator which is provided with means for generating anti-sound vibrations.

BRIEF DESCRIPTION OF THE DRAWINGS

The arrangement according to the invention will now be explained in greater detail with reference to the following figures, of which:

FIG. 1 shows a front view of a double-glazed window. Windowpane 1 and windowpane 2 placed behind it are separated by spacer elements 3 fitted on all sides. The width 4 and height 5 of the windowpane shall preferably be in the order of several tens of centimeters. As the dimensions are greater, the double-glazed window will be increasingly capable of producing low tones. In the centre of the windowpane, a piezo element 6, functioning as actuator, has been fitted to set windowpane 1 and windowpane 2 into vibration with respect to one another. The piezo element 6 can be provided with a varying voltage by means of two conductors 7.

FIG. 2A represents cross-section A—A as shown in FIG. 1. For the purpose of clarity, the distance 8 between the two windowpanes is shown substantially enlarged with respect to its normal proportion to the width 4 and the height 5. Usually, the distance 8 will not be more than 1 or 2 cm. The windowpanes 1 and 2 are connected to the spacer elements 3 by a coat of adhesive 9. The diameter 10 of the piezo element 6, which in this case is cylindrical, is also in the order of 1 or 2 cm. The piezo element 6 is mechanically connected to the two windowpanes 1 and 2 by means of a coat of adhesive 11. Each connector 7 is led down along the windowpane, through the spacer element 3, to be connected to the electric signal generator 12. The piezo element 6 will then contract or expand in accordance with the signal shape applied by the signal generator 12, which will cause windowpanes 1 and 2 to vibrate. In this way, both windowpanes act as a loud speaker. In a feasible embodiment, one of the two windowpanes can be given an increased thickness and rigidity, as a result of which the other windowpane will be set vibrating. This provides a certain measure of directional sensitivity. If required, several piezo elements 6 can be provided to increase the sound pressure.

FIG. 2B represents cross-section A—A of FIG. 1 where piezo element 6 has been omitted. In this situation, spacer elements 3 are used as piezo elements. This is a feasible solution if the central disposition of the piezo element 6 is a nuisance visually. The spacer elements 3 are then on two sides connected to the electric signal generator 12 via conductors 13.

FIG. 2C represents cross-section A—A of FIG. 1 where piezo element 6 is likewise omitted. The actuator is then formed by conductive layers 14 and 15 applied to the inside of windowpanes 1 and 2 in a vapour disposition process. Conductive layers 14 and 15 are via conductors 16 connected to an electric signal generator 17 which generates a sufficiently high voltage to realize electrostatic attraction or repulsion between both conductive layers. This will cause windowpanes 1 and 2 to vibrate in accordance with the supplied signal shape.

FIG. 2D represents cross-section A—A of FIG. 1 where piezo element 6 is likewise omitted. The actuator consists of a gas confined in space 18 between the two windowpanes 1 and 2. Via lead-through 19 provided in one of the spacer elements 3 and a connecting line 20, space 18 communicates with a pneumatic signal generator 21. The pressure in space 18 will then vary in accordance with the signal shape supplied by pneumatic signal generator 21 and will set windowpanes 1 and 2 into vibration. In another embodiment, space 18 contains a liquid and signal generator 21 is a hydraulic signal generator.

FIG. 3 represents an arrangement according to the invention comprising a single-pane window 22 which, by means of actuators 23, for instance piezo elements, is connected to a frame 24. The actuators can, in a manner analogous to the method described above, be connected to an electrical signal generator not shown here.

All above-described embodiments enable the signal generator to produce an anti-sound signal. An extraneous sound signal acting on an enclosed space can be recorded by means of microphones and be transmitted in phase opposition to the signal generator. This results in a substantial sound attenuation, particularly in the audio spectrum.

An alternative is to provide the space with one or several microphones, the signals of which can be applied to the signal generator, if necessary after application of a suitable filter. Any penetrating noise signals can thus be adjusted to a minimum in a closed loop. Both methods can also be applied in combination.

In a further favourable embodiment, the actuators are controlled in such a way that the one windowpane or, in the case of multiple parallel windowpanes, the inner windowpane motion is reduced to practically zero. The result of this is that no noise will enter the room via that windowpane. This can be effected by providing the inner windowpane with a sensor or a distributed set of sensors sensing the movement or absolute position of the inner windowpane. The sensor signals can now be used by a control system to control the actuator, or a distributed set of actuators, thereby minimizing the motion of the inner windowpane. In this way, an effective noise dampening system is obtained. The usage of a distributed set of actuators and a distributed set of sensors is particularly advantageous in the case of higher frequencies, when the window tends to vibrate in higher modes. A distributed control and dampening of the window pane motion can thus be obtained.

Figure 1:
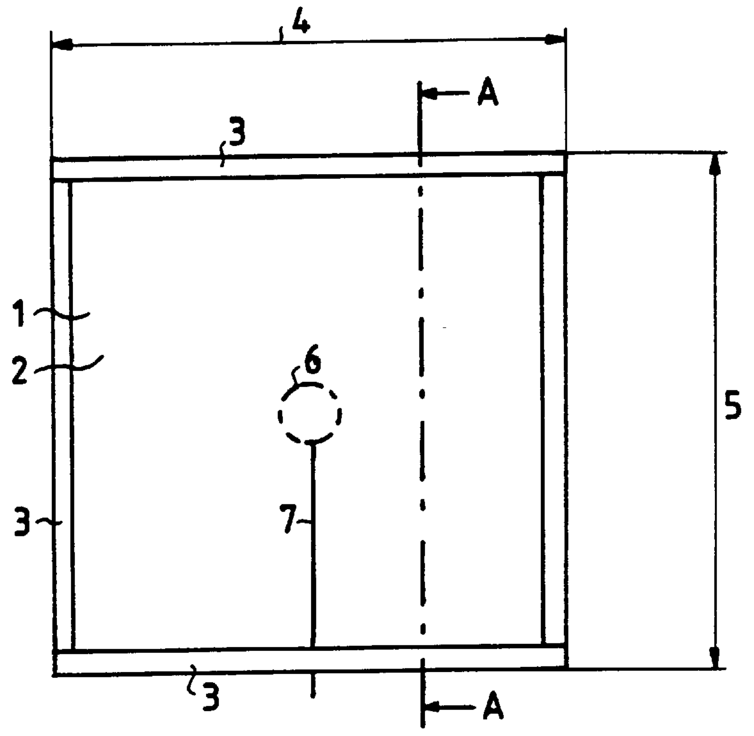
FIG. 1 represents a double-glazed window suitable for application in the arrangement according to the invention.
Figure 2A:
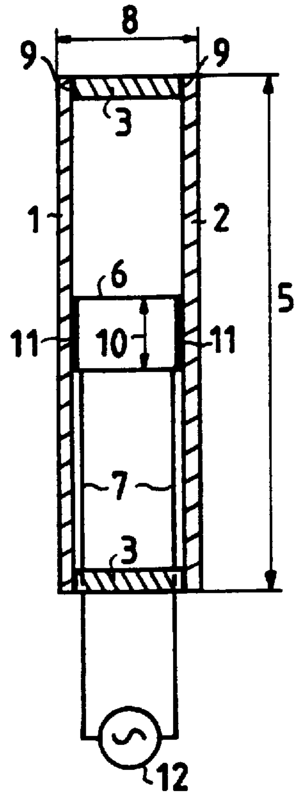
FIG. 2A through 2D represents cross-section A—A of FIG. 1 in respectively a first, second, third and fourth variant of the arrangement according to the invention.
Figure 2B:
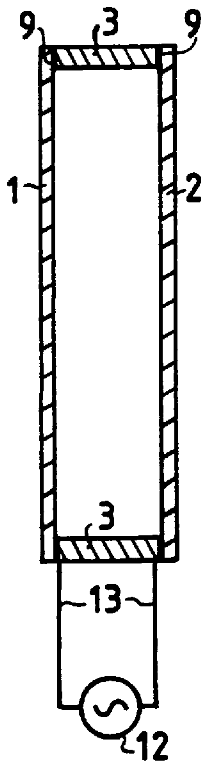
Figure 2C:
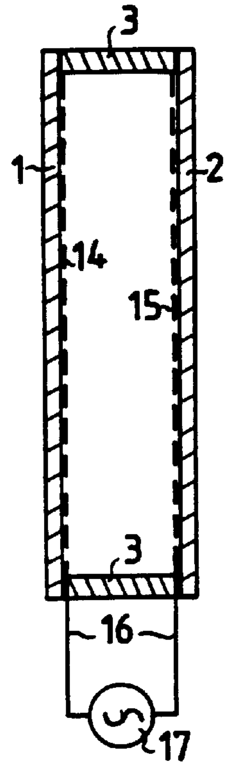
Figure 2D:
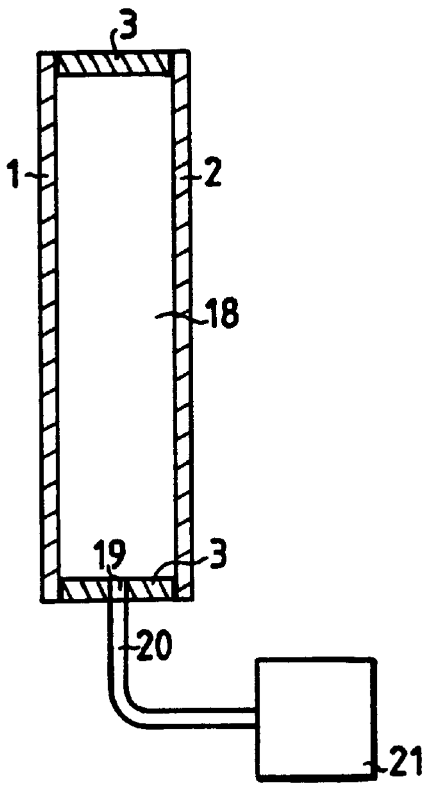
Figure 3:
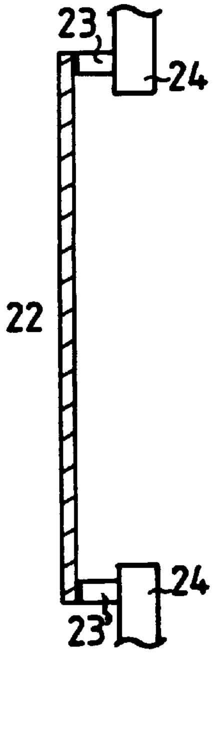
FIG. 3 represents a single-pane window which can be used in the arrangement according to the invention.
Figure 4:
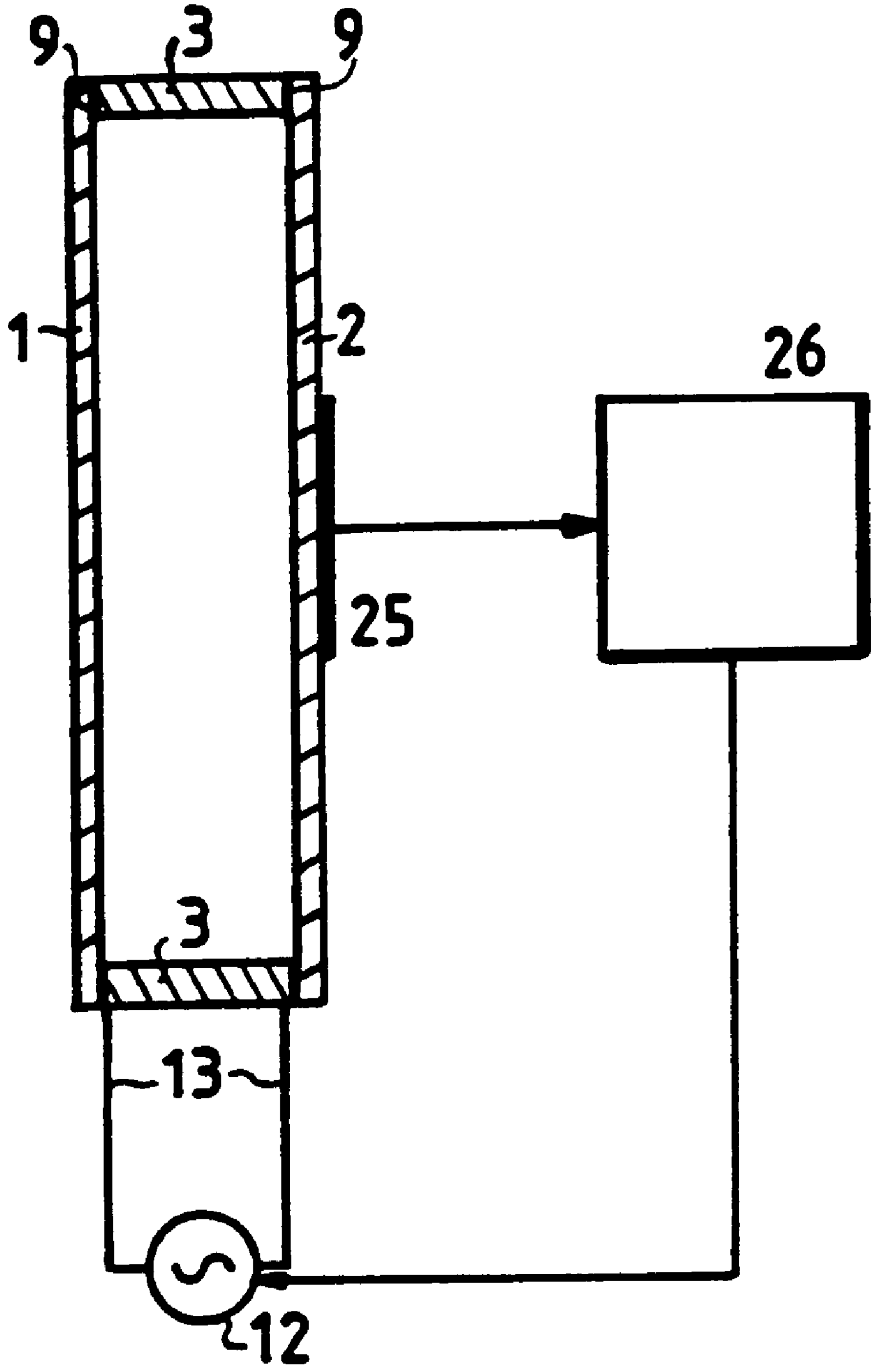
FIG. 4 represents an embodiment, wherein a windowpane is provided with a motion sensor.

An example of an embodiment wherein a window pane is provided with a motion sensor is given in FIG. 4, which is derived from the embodiment of FIG. 2B. The corresponding items in FIG. 4 are denoted with the same number as in FIG. 2B. In addition, windowpane 2 is provided with a motion sensor 25. The motion sensor may for example consist of two pairs of strain gauges appropriately glued on the windowpane. Alternatively, the motion sensor may consist of. a piezo electric transparent sheet. Preferably, the motion sensor 25 is applied where the windowpane motion has a maximum, being in the middle of the windowpane, when the window pane tends to vibrate at low frequencies in a base mode. Signals of motion sensor 25 are fed to controller 26. The controller 26 controls the signal generator 12, which generates the electrical signals for piezo actuators 3, in such a way that the signals from motion sensor 25 are minimized. The same principle can be applied, mutatis mutandis, for embodiments using a single windowpane and/or different types of actuators.

I claim:

1. A noise dampening system for dampening acoustic vibrations entering a building via a window, comprising:

a first substantially flat windowpane;

a second substantially flat windowpane parallel to the first windowpane, said first windowpane having a vibrational rigidity higher than the second windowpane;

an actuator configured to generate acoustic vibrations in at least one of the first and second windowpanes;

a sensor attached to the second windowpane and configured to sense motion of the second windowpane; and a control unit coupled to the sensor and the actuator, said control unit being configured to control the actuator to minimize the motion of the second windowpane using signals received from the sensor, said signals corresponding to the motion of the second windowpane sensed by the sensor.

2. A noise dampening system as claimed in claim 1, wherein the actuator is mounted between the first and second windowpane.

3. A noise dampening system as claimed in claim 2, wherein the actuator comprises:

a first conductive layer at least partially provided on the first windowpane; and a second conductive layer at least partially provided on the second windowpane, said actuator being activated by a voltage difference between the first and second conductive layers.

4. A noise dampening system as claimed in claim 2, wherein the actuator comprises:

a piezoelectric element positioned in the space between the two windowpanes, said piezoelectric element being mechanically connected to both windowpanes.

5. A noise dampening system as claimed in claim 1, wherein the sensor comprises:

a plurality of strain gauges.

6. A noise dampening system as claimed in claim 1, wherein the sensor comprises:

a plurality of piezoelectric elements.

7. A windowpane arrangement, comprising:

a first substantially flat windowpane;

a second substantially flat windowpane parallel to said first windowpane, said first windowpane having a vibrational rigidity higher than the second windowpane;

an actuator configured to generate acoustic vibrations in at least one of said first windowpane and said second windowpane;

a sensor attached to the second windowpane and configured to sense motion of the second windowpane; and connecting means for connecting the sensor and the actuator to a control system for minimizing the motion of the second windowpane using signals received from the sensor, said signals corresponding to the motion of the second windowpane sensed by the sensor.

* * * * *